United States Patent [19]

Hendrickson et al.

[11] Patent Number: 5,974,584
[45] Date of Patent: Oct. 26, 1999

[54] PARITY CHECKING IN A REAL-TIME DIGITAL COMMUNICATIONS SYSTEM

[75] Inventors: Alan Hendrickson; Paul Schnizlein, both of Austin, Tex.

[73] Assignee: DSP Group, Inc., Santa Clara, Calif.

[21] Appl. No.: 08/974,966

[22] Filed: Nov. 20, 1997

Related U.S. Application Data

[60] Provisional application No. 60/031,350, Nov. 21, 1996.

[51] Int. Cl.[6] ............................ G06F 11/00; H03M 13/00
[52] U.S. Cl. .......................... 714/800; 714/801; 714/703
[58] Field of Search ................................. 714/800, 801, 714/802, 803, 804, 805, 807, 703

[56] References Cited

U.S. PATENT DOCUMENTS

| | | | |
|---|---|---|---|
| 4,071,704 | 1/1978 | Moed | 714/714 |
| 4,907,248 | 3/1990 | Bretl | 375/244 |
| 4,962,501 | 10/1990 | Byers et al. | 714/805 |
| 5,517,510 | 5/1996 | Kuban et al. | 714/783 |

OTHER PUBLICATIONS

Sklar, B., "Digital Communications; Fundamentals and Applications," PTR Prentice Hall, Englewood Cliffs, New Jersey, 1988, p. 552.

*Primary Examiner*—Emmanuel L. Moise
*Attorney, Agent, or Firm*—Jeffrey C. Hood; Conley, Rose & Tayon

[57] ABSTRACT

In a digital communication system for voice signals, a system and method for improving the quality of a received signal. The invention comprises a system for arranging the data and parity bits in a data frame and a corresponding method for analyzing and using the received frames. In the present invention, the data are conveyed in short independent segments, such as one or a few ADPCM nibbles. The length of each segment is chosen to be short enough that the loss of one segment of data from the received signal does not significantly degrade the quality of the output analog signal. The transmitter generates a parity bit for each of these segments and composes transmit frames by alternating data segments with their corresponding parity bits. The receiver then receives each data segment along with its corresponding parity bit. This arrangement allows the receiver to identify specific received segments that contain errors, and minimizes the receiver's delay between receiving the segment and determining if contains an error. The invention also comprises a system and method for detecting such an erroneous segment and blanking it. If a received frame contains more than a threshold number of erroneous segments, then the remaining segments of the frame can be muted. Subsequent frames can then also be muted until one of the subsequent frames contains fewer than a second threshold number of errors.

18 Claims, 5 Drawing Sheets

PARITY CHECKING IN A REAL-TIME DIGITAL COMMUNICATIONS SYSTEM

PRIORITY

This application claims the benefit of priority of U.S. Provisional Application No. 60/031,350, titled "Spread Spectrum Cordless Telephone System and Method" and filed Nov. 21, 1996, now abandoned, whose inventors were Alan Hendrickson, Paul Schnizlein, Stephen T. Janesch, and Ed Bell.

BACKGROUND OF THE INVENTION

1. Field of the Invention

The invention relates to electronic communication and, more particularly, to the muting of erroneous sections of data in a received digital voice signal.

2. Description of the Related Art

The field of digital communication has evolved a variety of techniques for dealing with erroneous data received by a receiver. Design techniques to reduce the probability of transmission error are the first step in improving the quality of communicated data, but because of the diminishing returns on efforts to attain error-free transmission, they are not the last step. Rather than trying to attain an unrealistic system with zero error probability, system designers accept a small error probability (Pe) and take measures to reduce the effects of the few resulting errors.

Detection of errors is a communication receiver's first task in addressing them. Correcting the errors is the next, more complicated, task in improving the quality of the received data. Both of these procedures require that the data be transmitted with some degree of redundancy, such as block coding (using parity bits) and convolutional coding. For the receiver to simply detect transmission errors, parity or checksum information can be transmitted along with the data and analyzed by the receiver. To allow for the correction of transmission errors, the system can take two general approaches. In one approach the system requests a retransmission of the erroneous data. In this case the system must be capable of duplex operation: the receiver must be able to communicate back to the transmitter to make its request.

Correction by retransmission can significantly slow the overall communication rate since the data are delayed by the time required to request and receive a retransmission. This delay is generally less tolerable in the transmission of isochronous or "real-time" data such as voice signals than in the transmission of data representing other information, such as static images and text data. In limited-bandwidth systems that communicate real-time data, such as cellular and cordless telephones, the delay required for retransmission may be unacceptable.

The second general approach involves forward error correction, in which the data are transmitted with a larger proportion of redundant bits. The increased redundancy not only allows the detection of errors, but also provides the receiver with the ability to correct the detected errors. The correction is performed at the expense of a typically small delay from the overhead of the parity bits. Forward error correction does however significantly increase the complexity of both the transmitter and receiver units, since they must be able to generate and decode the error-correcting codes. Also, the increased number of parity bits required to perform error correction reduces the number of bits that can be used to carry the transmitted data. This reduction can be compensated by increasing the transmission bit rate, but a faster bit rate requires greater bandwidth—which is generally a limited resource. Thus both retransmission and forward error correction are unfeasible in many applications.

A simpler method of dealing with errors in real-time data is to mute the data stream during the portion containing an error. This technique is generally unacceptable for data representing information that was originally digital, such as data files and processor instructions, but it can be satisfactory for data representing analog signals such as voice signals. Alternatively, instead of muting the erroneous data, a stored sample of recent data can be substituted for the portion of erroneous data. If the duration of the muted or substituted portion is sufficiently small, this correction scheme can generate a subjectively acceptable reproduction of the original analog signals. Schemes that substitute previous voice samples for erroneous ones have been used in wireless telephone systems.

Existing digital cellular telephones using the CDMA and GSM protocols use extensive forward error-correction techniques to correct improperly received bits. Some prior-art cordless telephones use parity bits to detect the presence of errors, but not the specific location of those errors, in received data frames. Other prior-art cordless telephones, such as DECT and CT2, use no error-checking bits on voice channels. In some prior-art communications systems, after detecting a parity error in a received frame, the receiver repeats the preceding frame as a substitute for the erroneous frame of data. Each frame in these systems typically contains between 64 and 320 bits of data representing between 2 and 10 milliseconds of the voice signal. Upon detection of errors in a frame, a decision must be made to accept the entire frame, including its errors, or to reject it entirely. The rejection of the frame can be done by the substitution method described above, or by forcing the data to repeat some innocuous voice signal, such as silence, or by initiating some muting mechanism to reduce the amplitude of resulting transients in the decoded voice to some innocuous level. It would be advantageous to have a frame structure that allows more precise determination of the erroneous bits so that the remainder of a received frame can be preserved, thereby reducing the duration of the muted or substituted voice signal. Coupled with a fast, simple system for muting only the appropriate small portions of a received erroneous frame, a communications system using such a frame structure would be a significant improvement over the prior art.

SUMMARY OF THE INVENTION

The present invention is comprised in a digital communication system, such as a cordless or cellular telephone, that employs predictive voice coding (such as ADPCM) that is tolerant of a small incidence of erroneous received bits. The invention comprises a system for arranging the data and parity bits in a data frame and a corresponding method for analyzing and using the received frames. In the present invention, the data are conveyed in short independent segments, such as one or a few ADPCM (adaptive differential pulse-code modulation) nibbles (4-bit words). The length of each segment is chosen to be short enough that the loss of one segment of data from the received signal does not significantly degrade the perceived quality of the decoded voice signal, and long enough that the cost of the overhead is justified. The transmitter generates a parity bit for each of these segments and composes transmit frames by alternating data segments with their corresponding parity bits. The receiver then receives each data segment along with its corresponding parity bit. This arrangement allows the receiver to specifically identify received segments that contain errors, and minimizes the receiver's delay between receiving a segment and determining if the segment has an error.

A communications receiver according to the present invention identifies a specific small segment of erroneous data in a received data frame. It then "blanks" the analog voice output by replacing the erroneous segment with a code that causes the predictive voice decoder to continue its current prediction unaltered. If the frequency of erroneous segments is greater than a predetermined criterion, the receiver identifies a condition of persistent corruption in the voice data. It then "mutes" the voice output by replacing the persistently corrupted data with a code that causes the predictive voice decoder output to approach zero, thereby generating silence in the decoded voice output.

The invention enhances the performance of voice communications systems in which real-time communication is an important performance factor. Digital audio transmission systems of ADPCM in particular can benefit from the invention since they require a continuous stream of data without large transmission delays, and they can tolerate some small fraction of bit errors in the data stream. More generally, digital transmission systems employing predictive decoding to convey analog signals can benefit from the invention, since the effects of errors in small segments of the received analog signal can be mitigated by relying on the predictor output when the received data is erroneous.

BRIEF DESCRIPTION OF THE DRAWINGS

Other objects and advantages of the invention will become apparent upon reading the following detailed description and upon reference to the accompanying drawings in which.

DETAILED DESCRIPTION OF THE INVENTION

The following patents and patent applications are hereby incorporated by reference in their entirety as though fully and completely set forth herein:

U.S. Provisional Application No. 60/031350, titled "Spread Spectrum Cordless Telephone System and Method" and filed Nov. 21, 1996, now abandoned, whose inventors are Alan Hendrickson, Paul Schnizlein, Stephen T. Janesch, and Ed Bell;

U.S. application Ser. No. 08/968,030, titled "Verification of PN Synchronization in a Spread-Spectrum Communications Receiver" and filed Nov. 12, 1997, whose inventor is Alan Hendrickson;

U.S. application Ser. No. 09/148,263, titled "Timing Recovery for a Pseudo-Random Noise Sequence in a Direct Sequence Spread Spectrum Communications System" and filed Sep. 4, 1998, whose inventors are Alan Hendrickson and Ken M. Tallo; and U.S. application Ser. No. 09/148,268, titled "Frame Synchronization in a Digital Communication System" and filed Sep. 4, 1998, whose inventor is Alan Hendrickson.

Figure 1:
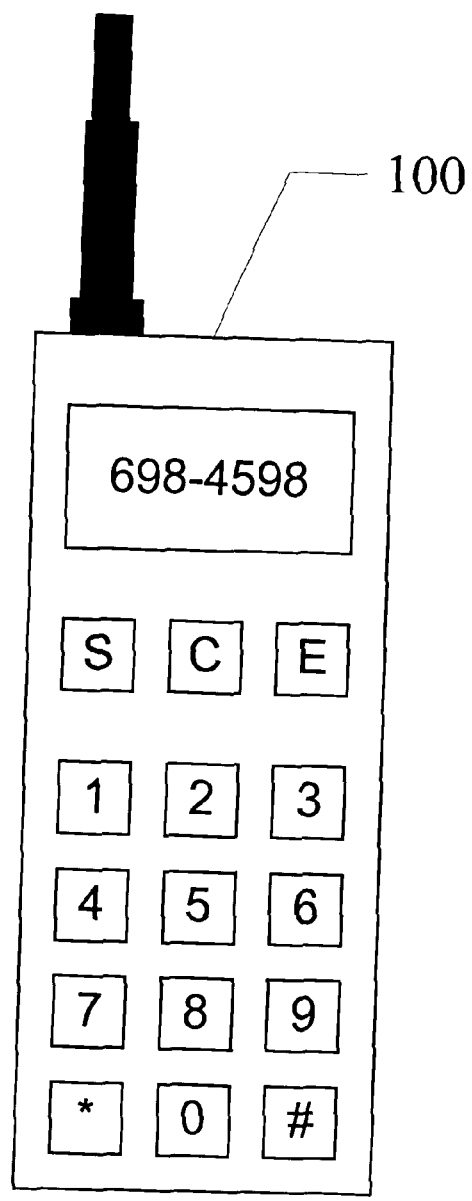
FIG. 1 shows a representative digital communications transceiver.
Figure 2:
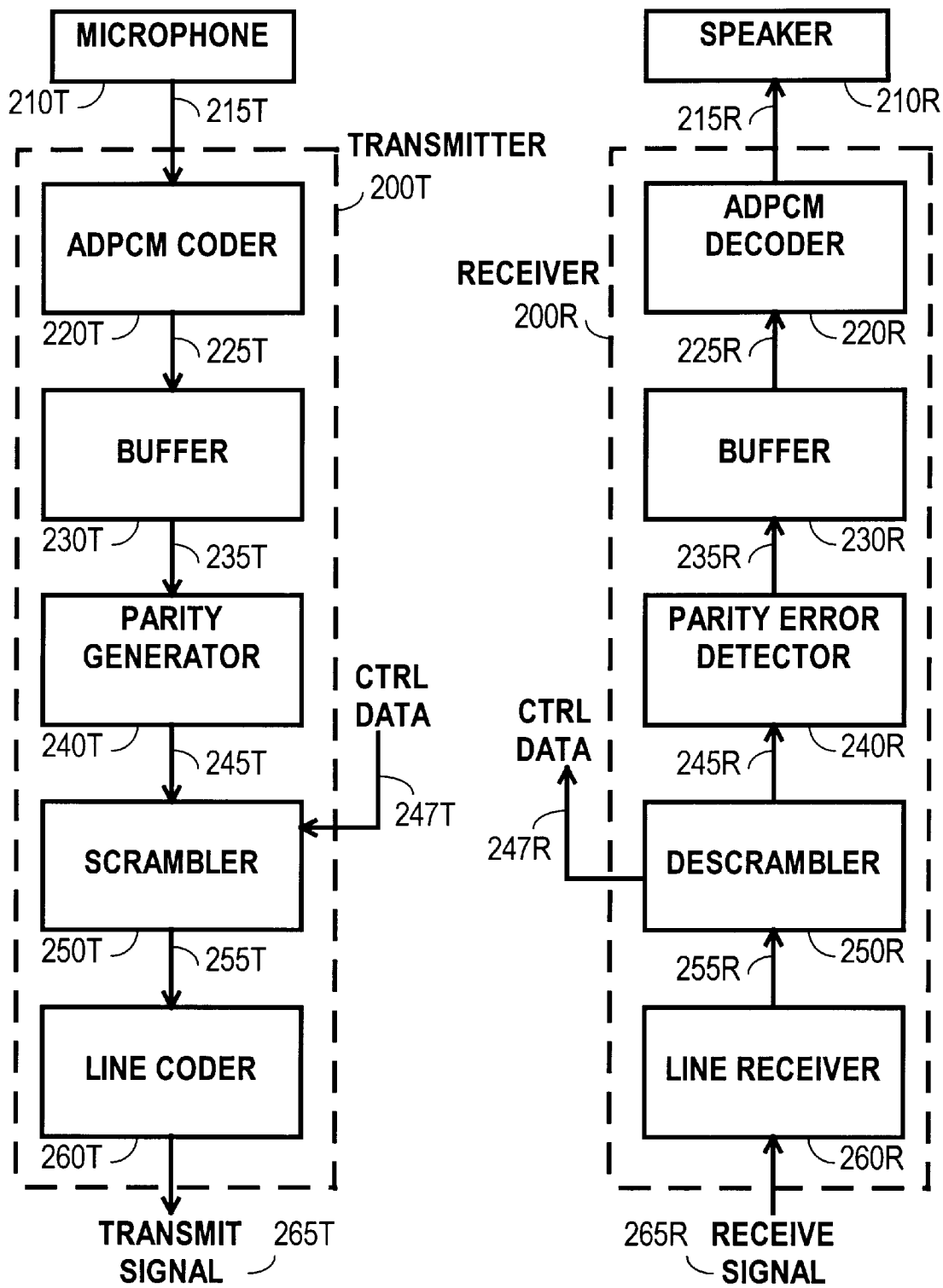
FIG. 2 is a block diagram of components comprised in the transceiver of FIG. 1.

FIGS. 1 and 2
Digital Communication Systems

A representative digital communications transceiver 100 is illustrated in FIG. 1. Pictured here is a hand-held transceiver, but the invention may alternatively be embodied in a base station transceiver (not shown). The transceiver 100 is preferably used in a cordless telephone system. The transceiver 100 comprises a transmitter that sends a digital signal to other transceivers, and a receiver that receives signals from other transceivers.

FIG. 2 is a block diagram of the transceiver from FIG. 1. As shown in FIG. 2 the transceiver of the preferred embodiment comprises a receiver unit 200R and a transmitter unit 200T. The transmitter 200T receives an analog voice signal 215T from a microphone 210T and converts the signal 215T to a line-coded baseband transmit signal 265T. This signal 265T is then upconverted to a transmitted RF signal by an RF modulator (not shown) for radio transmission. The receiver 200R performs the inverse of this process: it receives a line-coded baseband receive signal 265R that has been down-converted to baseband from a received RF signal and detected in a typical RF demodulator appropriate for the given modulation technique employed in the radio transmission. The receiver 200R processes the receive signal 265R to generate an analog voice signal 215R that drives a speaker 210R.

The transmit voice signal 215T is processed in the transmitter 200T by several blocks. The first block of the transmitter is an ADPCM (adaptive differential pulse code modulation) coder 220T that samples the analog voice signal 215T and produces from it a digital stream 225T of nibbles representing the voice signal 215T. This ADPCM stream 225T is sent to a FIFO buffer 230T that stores the digitized voice signal until a specific quantity of data is available for composing a frame of data as described below. The parity generator 240T then receives the buffer output 235T and generates a digital voice signal 245T in which the voice data are grouped into segments. As described below, the segments comprise voice data and parity bits for error-checking. In the scrambler 250T, these segments are interleaved with other data 247T, which carry control instructions and control information, into transmit frames. The principal function of the scrambler is to smooth or "whiten" the spectrum of the transmit signal 265T by XORing the interleaved digital voice signal 245T and the control data 247T with the output of a scrambling pattern generator, realized as a maximal length shift register (not shown). The scrambler 250T combines the voice and control data to generate a baseband signal 255T containing the transmit frames. This signal 255T is then provided to a line coder 260T that maps the discrete-time symbol sequence into analog waveforms appropriate for the selected modulation technique, thereby producing the line-coded baseband transmit signal 265T.

The receiver unit 200R comprises components that reverses the functions of the blocks in the transmitter unit 200T. The front-end of the receiver 200R is a line receiver 260R that receives the analog baseband receive signal 265R and operates on it to produce a discrete-time binary signal 255R containing the receive frames. This signal 255R includes the desired voice data as well as control commands and information for use by other circuits in the receiver. The baseband binary signal 255R is provided to the descrambler 250R, which XORs it with the same whitening sequence that is used in the scrambler 250T, thereby recovering the unscrambled receive frames. The descrambler 250R also separates the different data fields of the unscrambled receive frames into control signals 247R and the digital voice signal 245R. The digital voice signal 245R is processed in a parity-error detector 240R to generate an output 235R that holds segments of ADPCM voice data. As described below, the parity-error detector 240R has novel features and functionality that allow it to rapidly detect errors in the received digital voice signal 245R and modify only the affected ADPCM nibbles in its output 235R. The last two blocks of the receiver 200R are a FIFO buffer 230R and an ADPCM decoder 220R. The ADPCM nibbles of the error-detector output 235R are stored in the FIFO buffer 230R, which reproduces them sequentially at the rate with which they were originally sampled in a remote transmitter. The buffer output 225R is provided to the ADPCM decoder 220R, which reconstructs an analog voice signal 215R. This analog voice signal 215R is the receiver output that drives the speaker 210R.

Figure 3:
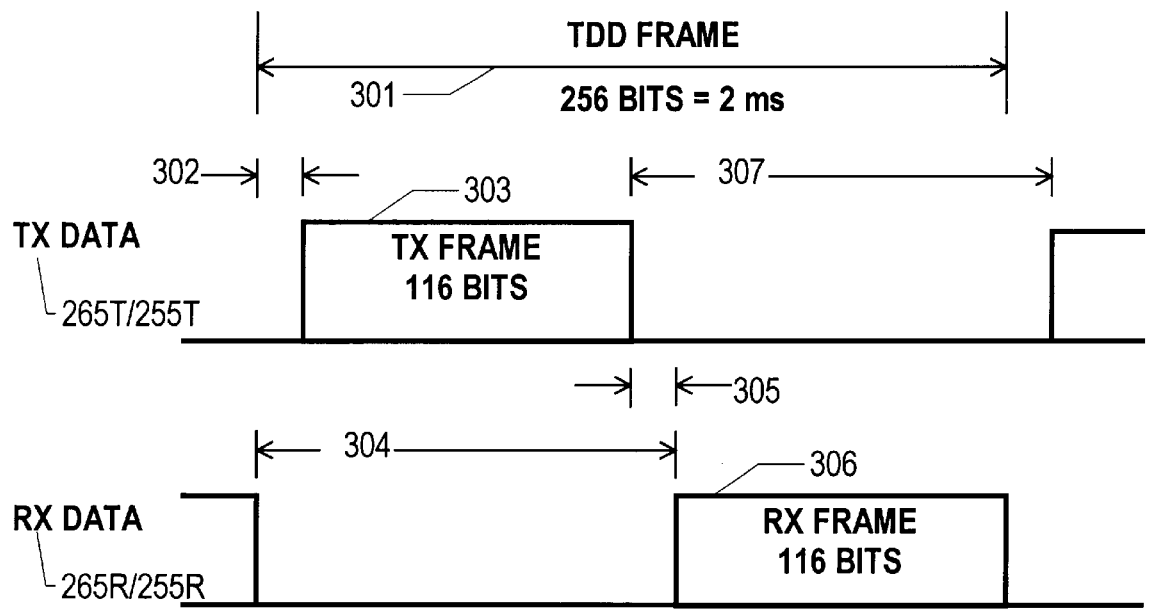
FIG. 3 illustrates the timing of the transmit and receive frames in a TDD system.
Figure 4:
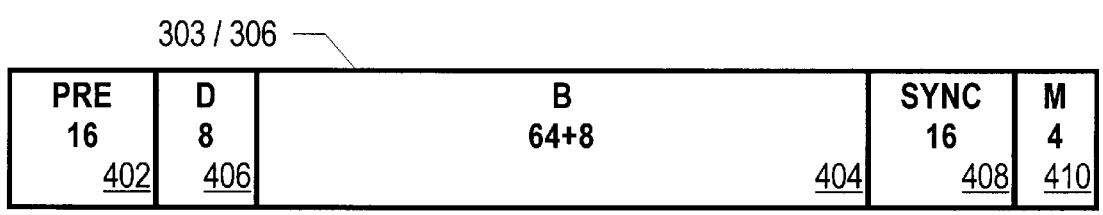
FIG. 4 shows the fields in a transmit or receive frame from FIG. 3.
Figure 5:
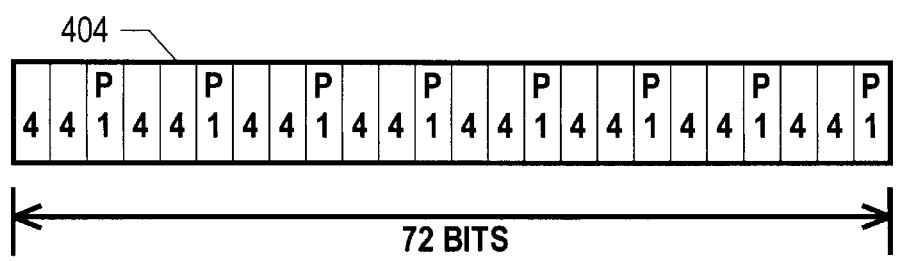
FIG. 5 shows the format of the B field from the receive frame in FIG. 4.

FIGS. 3–5
Structure of the Data Frames

FIG. 3 illustrates the timing of the transmit signals 265T and 255T and the receive signals 265R and 255R. The transceiver 100 from FIG. 1 is a time-division duplexing (TDD) device; that is, the transceiver 100 switches between alternately receiving and transmitting data, thereby accomplishing bi-directional communications on a single frequency channel. A duration of time in which the transceiver transmits and then receives data is a TDD frame 301.

FIG. 3 shows the active times for the baseband transmit and receive signals 255T and 255R in each 2 ms long TDD frame 301. For clarity, label numbers in this and the following figures are the same as in earlier figures for components and signals described previously. After receiving data, the transceiver 100 waits for a gap of time 302 and then begins transmission of a transmit frame 303. During this time that the baseband transmit signal 255T is active, the baseband receive signal 255R is inactive during an off-time 304. The transmit frame 303 is timed to end before the receive frame 306 is received. After the transmit frame 303 ends the transceiver 100 prepares to receive the receive frame 306. After another gap of time 305, the received frame 306 arrives, and the baseband receive signal 255R is active. During this time the baseband transmit signal 255T is inactive during another off-time 307. The TDD frame repeats, allowing continuing bi-directional use of the channel.

The receive frame 306 has substantially the same duration as a transmit frame 303; they each carry 58 symbols at a 64 kS/sec rate, so the duration of each transmit or receive frame 303 or 306 is 0.90625 ms—a little less than one half of the full period of a TDD frame 301. The two interspersed gaps 302 and 305 each have a nominal duration of 0.09375 ms, giving the TDD frame 301 its total duration of 2 ms.

FIG. 4 shows the format of one of the transmit or receive frames 303 or 306. Each of these frames is divided into a series of fields, with each field carrying a particular type of data. During transmission, transmit frames are assembled by the scrambler 250T which receives the various data streams and interleaves their contents into transmit frames. These frames include fields for two logical channels: a B channel for communicating voice data and a D channel for packetized control data. The B field 404 carries the B channel, which conveys the desired data of voice signals 245T and 245R. Each B field 404 carries 16 nibbles (64 bits) of ADPCM voice data and 8 parity bits. The D channel is carried by the 8-bit D field 406. The D channel conveys the control data of signals 247T and 245R, through which system information is communicated between transceivers. A preamble field 402 in each frame 303 or 306 contains no communicated information: its purpose is to provide a reference signal during the settling of phase-lock loops in the receiver. The 16-bit SYNC field 408 is used by the receiving transceiver to synchronize its frame clock with that of the transmitting transceiver.

In one embodiment of the invention, the transceiver is a direct-sequence spread-spectrum (DSSS) device in a DSSS communication system, and the transceiver must synchronize its locally generated pseudo-noise sequence with that of the receive signal 265R. The M field 410 is a 4-bit long measure field used to assess the spreading code synchronization of the receiver.

During reception, the receive frames 306 in the digital voice signal 245R are disassembled by the descrambler 250R. The descrambler places the contents of the B field 404 into the digital voice signal 245R. The control data from the D field 406 go into the control data signal 247R.

FIG. 5 shows the data format of the B fields 404 that conveys the digital voice data. Since the digital voice signals 245T and 245R are sequences of B fields, FIG. 5 also shows the timing of data in those signals. Each B field comprises eight parity bits. Each parity bit in the field is immediately proceeded by the two nibbles, or eight bits, of voice data to which the parity bit applies. Each nibble of voice data is one ADPCM word representing 125 microseconds of sampled voice data. Altogether then, the 16 ADPCM words in each B field convey two milliseconds of voice data. Thus, two milliseconds of voice data is conveyed in each transmit frame. These two milliseconds of voice data have the same duration as each TDD frame 301, so enough data are conveyed in each transmit frame to permit real-time communication.

The format of the B field 404 in the invention has several advantages over the prior art. Each parity bit is associated with eight bits of ADPCM data, therefore, an error in the B field can be identified to within two ADPCM nibbles. This allows the receiver to pinpoint the location of any errors to within 250 microseconds in the received signal. Any subsequent correction can be performed on merely these 250 microseconds of data. Another advantage of the B field format presented here is that each of the parity bits immediately follows its corresponding eight bits of data. Therefore, errors can be identified as they occur in the receiver; the receiver does not have to receive an entire data frame of voice signal before identifying errors in the frame.

Figure 6:
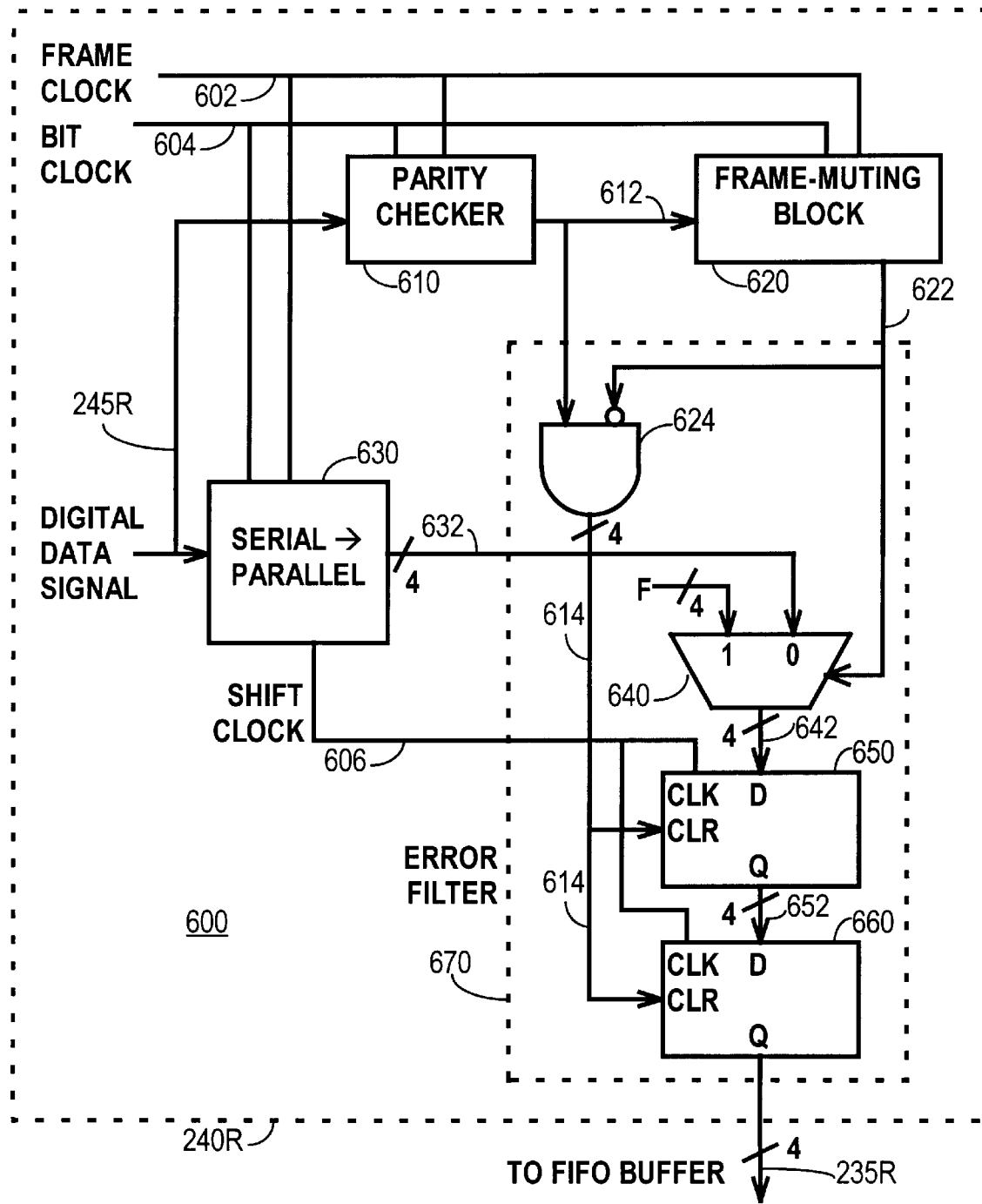
FIG. 6 is a schematic of the parity-checking and data-muting system in the parity-error detector shown in FIG. 2.

FIG. 6
Parity Checking and Data Muting System

The parity checking and data muting system 600 is shown in FIG. 6. This system is comprised in the parity-error detector 240R from FIG. 2. The input data signal is the digital voice signal 245R, which provides voice data in a series of B fields, and the output of this system is the error-detector output 235R, which carries voice data in a series of ADPCM nibbles. The input signal 245R contains B fields which may have erroneous ADPCM nibbles. In the error-detector output 235R generated by this system 600, the erroneous ADPCM words have been modified by substituting them with a value dependent on the characteristics of the detected errors.

As described earlier, the B fields in input 245R have ADPCM words and parity bits. The ADPCM words are placed into a parallel format by a serial-to-parallel converter 630, which receives the digital voice signal 245R and generates a four-bit-wide output signal 632 that carries the ADPCM words. The B field data 245R are also provided to a parity checker 610 which generates a parity error signal 612. The parity error signal 612 indicates an error in the most recent two-nibble field of ADPCM data. This signal is used by an error filter 670 to blank erroneous ADPCM words by setting the erroneous data to an appropriate code, such as zero, that causes the predictor to continue using its current prediction. The error filter 670 thereby mitigates the unpleasant effects of corrupted data on the analog voice signal 235R generated by the ADPCM decoder 220R.

To perform this blanking, the error filter 670 receives the 4-bit ADPCM output 632 of the serial-to-parallel converter 630, and the parity error signal 612 from the parity checker 610. The error filter 670 also receives the shift clock signal 606, which indicates the timing of the words in the ADPCM signal 632. Two 4-bit registers 650 and 660 contain the two ADPCM nibbles associated with the parity error signal 612. The registers 650 and 660 are cleared to zero if the parity-error signal 612 is TRUE, and are otherwise unaltered. The zero code is chosen because it causes the ADPCM decoder 220 to maintain its current output prediction.

In addition to the shift clock signal 606, the parity checking and data muting system 600 uses a frame clock 602 and a bit clock 604. The frame clock 602 indicates the timing of the receive frames 306 in the digital voice signal 245R, and the bit clock 604 indicates the timing of the bits in the receive frames 306. These two clock signals are provided to the parity checker 610 and the serial-to-parallel converter 630 so that these circuits 610 and 630 may identify ADPCM word-parsing boundaries and the positions of the parity bits in the serial data stream.

FIG. 6 also shows the interaction of the error filter 670 with the parity checker 610 and a frame-muting block 620. Inside the filter 670, a multiplexer 640 receives the 4-bit ADPCM signal 632 and a frame-mute signal 622 described below. The multiplexer 640 passes the 4-bit ADPCM signal 632 to the registers 650 and 660 when the frame-mute signal 622 is FALSE. When the frame-mute signal 622 is TRUE, the multiplexer 640 passes a 4-bit hexadecimal F signal, in lieu of the ADPCM signal 632, to the registers 650 and 660.

In one embodiment of the error filter 670, as shown in FIG. 6, the two registers 650 and 660 are D flip-flops. The first flip-flop 650 receives either the 4-bit ADPCM signal 632 or the hex F from the multiplexer 640. The output 652 of the first D flip-flop 650 is then provided to the second D flip-flop 660, which produces the error-detector output 235R that holds the error-filtered ADPCM words. The D flip-flops 650 and 660 are clocked by the shift clock signal 606 so that the ADPCM words propagate through the error filter at the same rate as new words are received from the serial-to-parallel converter. As shown in the figure, the clear inputs on the flip-flops 650 and 660 receive a CLEAR signal 614 that is the same as the parity error signal 612 when frame muting (discussed below) is not in effect. Thus, upon detection of an erroneous pair of ADPCM words, the parity checker 610 clears the contents of the two D flip-flops 650 and 660 to zero. The parity checker 610 thereby blanks the output in signal 235R corresponding to the two erroneous ADPCM words.

A second function of the parity checking and data muting system 600 is the continuous muting of the error-detector output 235R if a threshold number of errors are detected in a single received frame 306. This function is carried out by the frame-muting block 620. The frame-muting block 620 receives the frame clock 602 and the bit clock 604. This block 620 has a parity error counter, which counts the number of errors received in each receive frame 306, and a frame-mute register. The frame-mute register is set when the error count exceeds a predetermined threshold, for example three, indicating severe corruption of the received data in the digital voice signal 245. The frame-mute register is cleared upon receipt of a frame with detected errors numbering less than a second predetermined threshold, for example two, indicating an end to the severe corruption of received data. The value in this register is provided to the error filter 670 by a frame-mute signal 622 that the muting block 620 generates. The frame-mute signal 622 controls the multiplexer 640. As discussed above, the multiplexer output 642 is the ADPCM signal 632 when the frame-mute signal 622 is FALSE. If the frame-mute signal 622 is TRUE, the multiplexer output 642 is a hex F. Since it is the output 642 of the multiplexer 640 that is passed to the registers 650 and 660, the result of the frame-mute signal 622 is to create a string of hex F ADPCM words until the frame-mute signal 622 is reset by the frame-muting block 620. The hexadecimal code F is chosen to replace the corrupted ADPCM nibbles during frame mutes because the behavior of the ADPCM decoder is for its analog output to converge to zero when its input is consistently hex F. It can therefore be seen that this circuit mutes the analog output 215R during conditions of extremely error-prone reception.

An AND gate 624 prevents zeroing (blanking) of the error filter output 235R during frame mutes. The AND gate 624 receives the parity-error signal 612 and the compliment of the frame-mute signal 622. Its output is the CLEAR signal 614 that is provided to the registers 650 and 660. Thus, when frame-mute signal is TRUE, it can be seen that the hex F codes in registers 650 and 660 are not cleared to zero.

FIG. 7

Flow Chart for Frame Muting

Figure 7:
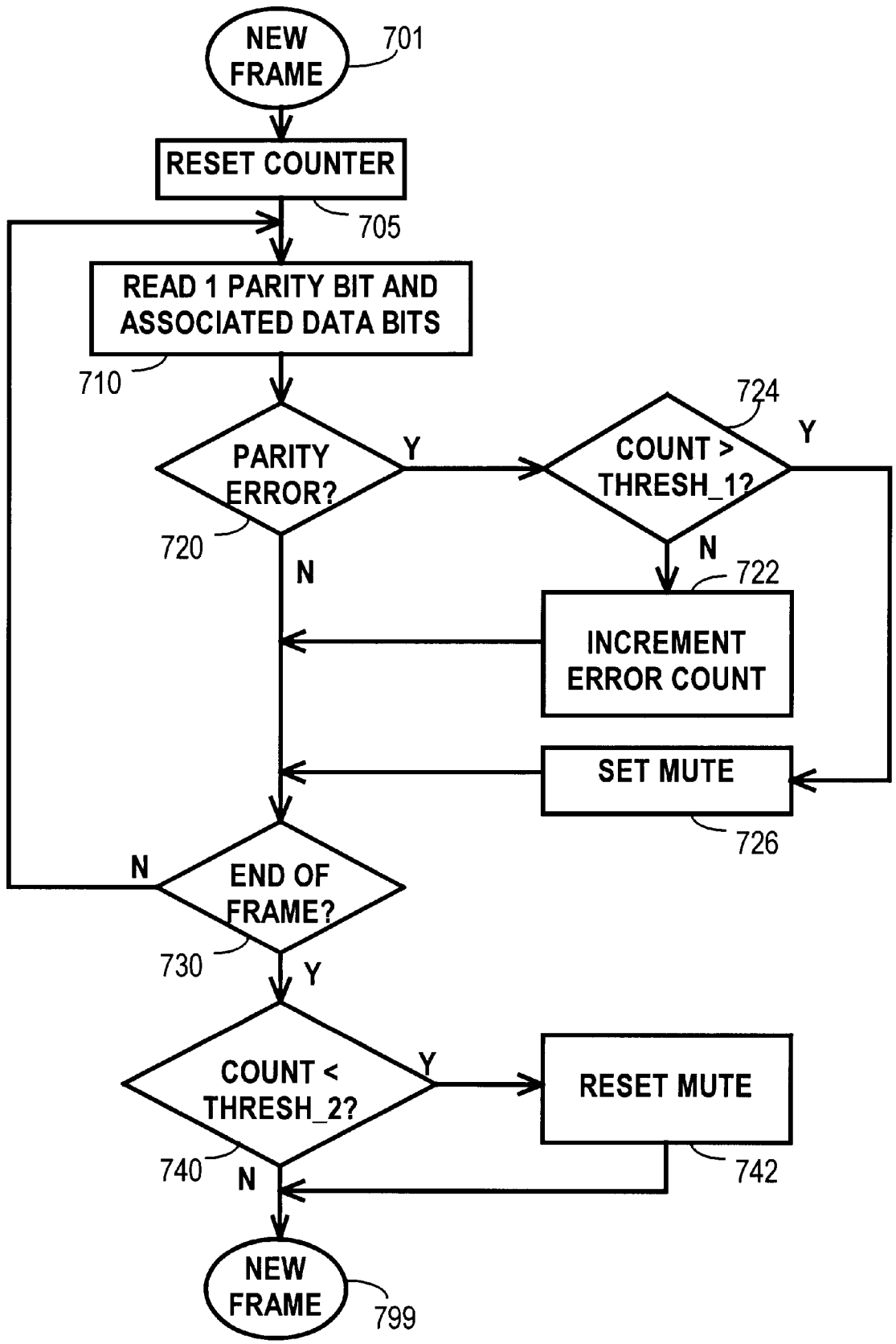
FIG. 7 is a flowchart of the frame-muting block shown in FIG. 6.

FIG. 7 shows the procedure followed by the parity checker 610 and the frame-muting block 620 to set and reset the mute signal 622. The start condition for this flow chart is the reception in step 701 of a new frame 306 from the digital voice signal 245R by the parity checker 610. The frame-muting block sets the error count to zero for the new frame in step 705. The parity checker 610 then reads one parity bit and the associated data bits from the frame in step 710. In step 720, the parity checker 610 then determines if a parity error has occurred in the data bits, which represent two ADPCM words. The error status is provided to the frame-muting block 620 via the parity error signal 612. In the case of an error, the frame-muting block 620 checks in step 724 to see if the count of errors has surpassed the threshold of errors (for example, three) acceptable by the block. If this threshold has not been exceeded, the frame-muting block 620 increments the error count in step 722, thereby recording the occurrences of the erroneous ADPCM words in the current frame. If instead the threshold error count has been exceeded, the frame-muting block sets its mute register in step 726. This register causes the output frame-mute signal 622 to have a TRUE value, thereby muting the remainder of the frame and subsequent frames through the multiplexer 640. After the mute register is set in step 726, or after the error count is incremented in step 722, or if no parity error had been detected in the two ADPCM words in step 720, the frame-muting block proceeds to step 730 to determine if the end of the current frame has been reached. If there are more voice data available in the current frame, the frame-muting block returns to step 710 to read the next parity bit and the associated data bits. If the end of the current frame has been reached, the frame-muting block proceeds to step 740 where it assesses the quality of the current frame.

In step 740, the error count tracked by step 722 is checked: an error count less than the second predetermined threshold (for example, two) indicates that the frame was not severely corrupted. If the current frame was not severely corrupted, the mute register is reset to FALSE in step 742, thereby allowing received ADPCM words to proceed to the FIFO buffer 230R without being muted. After the frame-muting block 620 resets the mute register in step 742 or determines in step 740 that the latest frame contained more than the second predetermined threshold count of parity errors, the parity checker 610 is ready to accept a new frame in the terminal step 799.

It is to be understood that multiple variations, changes and modifications are possible in the aforementioned embodiments of the invention described herein. Although certain illustrative embodiments of the invention have been shown and described here, a wide range of modification, change, and substitution is contemplated in the foregoing disclosure and, in some instances, some features of the present invention may be employed without a corresponding use of the other features. Accordingly, it is appropriate that the foregoing description be construed broadly and understood as being given by way of illustration and example only, the spirit and scope of the invention being limited only by the appended claims.

We claim:

1. A method for receiving signals in a communications system, the method comprising:

receiving a frame, wherein said frame comprises a plurality of modulated symbols, wherein said frame includes a plurality of data portions and a plurality of parity portions interspersed with said data portions, and wherein each of said data portions is associated with a corresponding parity portion;

analyzing each of said plurality of data portions in conjunction with its corresponding parity portion;

determining if a parity error occurs in response to said analyzing each of said plurality of data and parity portions, wherein a first set of one or more error-free data portions comprises data portions that do not result in parity errors in response to said analyzing, and wherein a second set of one or more erroneous data portions comprises data portions that do result in parity errors in response to said analyzing; and constructing an output signal using said first set of error-free data portions, wherein said second set of erroneous data portions is not used to construct said output signal;

wherein each data portion in said plurality of data portions has a size that is sufficiently small, such that non-use of one of said data portions results in substantially no degradation in quality of said output signal.

2. The method of claim 1, wherein said plurality of data portions represent an audio signal, and wherein non-use of one of said data portions results in substantially no audible degradation of said audio signal.

3. The method of claim 1, wherein said constructing said output signal includes using a set of substituting data portions in said output signal, wherein said set of substituting data portions substitute for said second set of erroneous data portions.

4. The method of claim 3, wherein said substituting data portions comprise a constant stream of data that cause a predictive coder to maintain a preceding prediction.

5. The method of claim 1, further comprising:

determining a number of parity errors in said frame prior to said constructing said output signal; and determining if said number of parity errors is greater than a predetermined threshold;

wherein none of the remaining data portions of said frame are used in constructing said output signal if said number of parity errors is greater than said threshold.

6. The method of claim 5, wherein none of the data portions of subsequent corrupt frames are used in constructing said output signal if said number of parity errors is greater than said threshold, until a number of parity errors in a subsequent frame is less than a second predetermined threshold.

7. The method of claim 1, wherein each of said plurality of data portions comprises 8 bits of data, and wherein each of said plurality of parity portions comprises 1 bit of data.

8. The method of claim 1, wherein each of said plurality of data portions comprises 8 bits of data, wherein each of said plurality of parity portions comprises 1 bit of data; and wherein said frame comprises 8 data portions and 8 parity portions.

9. A communications receiver for receiving signals, the receiver comprising:

an input for receiving a frame in a digital data signal, wherein said frame comprises a plurality of modulated symbols, wherein said frame includes a plurality of data portions and a plurality of parity portions interspersed with said data portions, and wherein each of said data portions is associated with a corresponding parity portion;

a parity checker coupled to said input, wherein said parity checker analyzes each of said plurality of data portions in conjunction with its corresponding parity portion, and wherein said parity checker determines if a parity error occurs in response to said analyzing each of said plurality of data and parity portions, wherein a first set of one or more error-free data portions comprises data portions that do not result in parity errors in response to said analyzing, and wherein a second set of one or more erroneous data portions comprises data portions that do result in parity errors in response to said analyzing; and an error filter coupled to said input and to said parity checker, wherein said error filter uses said first set of error-free data portions to construct an output signal, and wherein said error filter does not use said second set of erroneous data portions to construct said output signal;

wherein each data portion in said plurality of data portions has a size that is sufficiently small, such that non-use of one of said data portions results in substantially no degradation in quality of said output signal.

10. The receiver of claim 9, wherein said plurality of data portions represent an audio signal, and wherein non-use of one of said data portions results in substantially no audible degradation of said audio signal.

11. The receiver of claim 9, wherein said output signal comprises:

said first set of error-free data portions; and a set of substituting data portions that substitute for said second set of erroneous data portions.

12. The receiver of claim 11, wherein said substituting data portions comprise a stream of data that cause a predictive coder to maintain a preceding prediction.

13. The receiver of claim 9, further comprising a frame-muting block coupled to said parity checker, wherein said frame-muting block generates a frame-mute signal, wherein said frame-mute signal indicates that a number of parity errors in said frame is greater than a threshold number of errors, wherein said frame-muting block sends said frame-mute signal to said error filter, and wherein said error filter uses none of the remaining data portions of said frame in constructing said output signal if said number of parity errors is greater than said threshold.

14. The receiver of claim 13, wherein said error filter uses none of the data portions of subsequent frames in constructing said output signal if said number of parity errors is greater than said threshold, until a number of parity errors in a subsequent frame is less than a second predetermined threshold.

15. The receiver of claim 13, wherein said frame-muting block comprises:

a parity error counter coupled to said parity checker, wherein said parity error counter stores a count of said parity errors detected by said parity checker; and a frame-mute register coupled to said parity error counter, wherein said frame-mute register indicates a frame error if said number of parity errors is greater than said threshold;

and wherein said frame-muting block generates said frame-mute signal in response to a value in said frame-mute register.

16. The receiver of claim 13, wherein said receiver operates to mute said output signal in place of using said remaining data portions of said frame if said number of parity errors is greater than said threshold.

17. The receiver of claim 9, wherein each of said plurality of data portions comprises 8 bits of data, and wherein each of said plurality of parity portions comprises 1 bit of data.

18. The receiver of claim 9, wherein each of said plurality of data portions comprises 8 bits of data, wherein each of said plurality of parity portions comprises 1 bit of data; and wherein said frame comprises 8 data portions and 8 parity portions.

* * * * *